United States Patent
Hayes et al.

(10) Patent No.: US 7,245,506 B2
(45) Date of Patent: Jul. 17, 2007

(54) SYSTEM FOR REDUCING NOISE INDUCED FROM REFERENCE PLANE CURRENTS

(75) Inventors: Stuart W. Hayes, Round Rock, TX (US); Shane Chiasson, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 269 days.

(21) Appl. No.: 10/753,615

(22) Filed: Jan. 8, 2004

(65) Prior Publication Data

US 2005/0150105 A1    Jul. 14, 2005

(51) Int. Cl.
*H05K 1/11* (2006.01)
*H05K 1/14* (2006.01)

(52) U.S. Cl. ............... 361/794; 361/792; 361/795; 174/262

(58) Field of Classification Search ........ 361/760–764, 361/792–795; 174/255–266; 257/700–704, 257/723–724
See application file for complete search history.

(56) References Cited

U.S. PATENT DOCUMENTS

| | | | |
|---|---|---|---|
| 5,202,640 A | 4/1993 | Schaaf et al. ............... 324/537 |
| 5,640,048 A * | 6/1997 | Selna ......................... 257/738 |
| 5,777,347 A | 7/1998 | Bartelink ..................... 257/24 |
| 5,854,662 A | 12/1998 | Yuyama et al. .............. 348/790 |
| 6,047,582 A | 4/2000 | Daehn et al. .................. 72/57 |
| 6,050,120 A | 4/2000 | Daehn et al. .................. 72/57 |
| 6,050,121 A | 4/2000 | Daehn et al. .................. 72/57 |
| 6,084,779 A * | 7/2000 | Fang ........................... 361/763 |
| 6,085,562 A | 7/2000 | Daehn et al. .................. 72/57 |
| 6,128,935 A | 10/2000 | Daehn et al. .................. 72/57 |
| 6,236,572 B1 * | 5/2001 | Teshome et al. ............ 361/794 |
| 6,242,923 B1 | 6/2001 | Scaman et al. ............. 324/529 |
| 6,379,978 B2 | 4/2002 | Goebel et al. ................ 438/3 |
| 6,700,076 B2 * | 3/2004 | Sun et al. .................... 174/262 |

* cited by examiner

*Primary Examiner*—Tuan Dinh
(74) *Attorney, Agent, or Firm*—Baker Botts L.L.P.

(57) ABSTRACT

A method of reducing noise induced from reference plane currents is disclosed. The method includes routing a first path for an electrical trace on a circuit board such that the first path references a voltage plane. The method further includes routing a second path for the electrical trace on the circuit board such that the second path references a ground plane whereby the second path is substantially similar to the first path. The method further includes electrically coupling the first path to the second path at each of the ends of the first and second paths such that noise induced into the electrical trace is reduced.

16 Claims, 2 Drawing Sheets

SYSTEM FOR REDUCING NOISE INDUCED FROM REFERENCE PLANE CURRENTS

TECHNICAL FIELD

This disclosure relates in general to the field of computers, and more particularly to a method of reducing noise induced from reference plane currents in a computer system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use, such as financial transaction processing, airline reservations, enterprise data storage, or global communications. In addition, information handling systems may include a variety of hardware and software components that may be configured to process, store, and communicate information and may include one or more computer systems, data storage systems, and networking systems.

One type of information handling system is a computer system. Examples of the computer system include, but are not limited to, mainframes, workstations, servers, personal computers, notebook computers, laptop computers, and personal digital assistants (PDA). Each computer system may include a processor, memory, and storage media such as a hard drive.

As consumer demand has increased for smaller and more compact computer systems, manufacturers strive to implement new methods to meet these demands. One of these methods includes manufacturing circuit boards with narrow copper traces. Given the smaller and more compact size, the traces are typically routed in close proximity (usually above or below) to a voltage or ground plane.

Voltage planes or ground planes on a circuit board are commonly referred to and serve as "reference planes" for traces routed on either side of them. These reference planes can also function to distribute power by carrying current between power sources, such as voltage regulators, and their associated loads, such as processors and chips. Some reference planes will serve as voltage planes (e.g., a plane with a non-zero voltage) and other planes will serve as ground planes. As such, current loads are drawn from a voltage plane and returned to a ground plane to complete an electrical circuit.

However, any large or fast current carried on a plane can cause "noise" to couple to a trace that is routed near the plane. Generally, the noise is most evident when the trace is routed parallel to the direction of the current change. Manufacturers who have attempted to correct this problem typically have installed filters, such as a capacitor or a low-pass filter made from a capacitor and a resistor, on the trace.

Unfortunately, with some circuit boards, the size of filter needed to remove the noise from the trace also blocks some of or the entire signal on the trace. Moreover, the use of series resistors in low-pass filters can change the voltage drop across a diode. Thus, in some instances, the filter will introduce signal errors into the trace.

Other attempts to correct the noise problem include physical modifications to the circuit board or to the information handling system. Modifications include relocating components such that traces avoid routes over high current densities or routing traces perpendicular to current densities. Given the current mechanical or size constraints of some information handling systems, the relocation of components is simply not an option.

In one particular correction attempt, manufacturers routed sensitive traces near ground planes instead of current planes to reduce the amount of induced noise. Because the amount of induced noise is related to the density of current in the plane, this correction assumes that the ground planes in the circuit board have a lower current density than the voltage planes (e.g., there are more ground planes than current planes).

SUMMARY

Thus, a need has arisen for a method of reducing noise induced from reference plane currents.

In accordance with the teachings of the present invention, the disadvantages and problems associated with a method of reducing noise induced from reference plane currents is disclosed. The method includes routing a first path for an electrical trace on a circuit board such that the first path references a voltage plane. The method further includes routing a second path for the electrical trace on the circuit board such that the second path references a ground plane whereby the second path is substantially similar to the first path. The method further includes electrically coupling the first path to the second path at each of the ends of the first and second paths such that noise induced into the electrical trace is reduced.

In another embodiment, a circuit board includes a voltage plane forming a first layer of the circuit board. The voltage plane provides an electrical current. The circuit board further includes a ground plane forming a second layer of the circuit board. The ground plane provides a ground for the electrical current. The circuit board further includes an electrical trace routed over a portion of the circuit board. The electrical trace includes a first path and a second path such that the first path references the ground plane and the second path references the voltage plane whereby the first path is substantially similar to the second path. The first path is electrically coupled to the second path at each of the ends of the paths such that noise induced into the electrical trace is reduced.

In further embodiments, an information handling system includes a processor, a memory communicatively coupled to the processor and a circuit board having an electrical trace. The circuit board reduces noise on the electrical trace induced from a reference plane. The circuit board includes a voltage plane forming a first layer of the circuit board. The voltage plane provides an electrical current. The circuit board further includes a ground plane forming a second layer of the circuit board. The ground plane provides a ground for the electrical current. The circuit board further includes an electrical trace routed over a portion of the circuit board. The electrical trace includes a first path and a second path such that the first path references the ground plane and the second path references the voltage plane whereby the first path is substantially similar to the second path. The first path is electrically coupled to the second path at each of the ends of the paths such that noise induced into the electrical trace is reduced.

All, some, or none of these technical advantages may be present in various embodiments of the present invention. Other technical advantages will be apparent to one skilled in the art from the following figures, descriptions, and claims.

BRIEF DESCRIPTION OF THE DRAWINGS

A more complete understanding of the embodiments of the present disclosure and advantages thereof may be acquired by referring to the following description taken in conjunction with the accompanying drawings, in which like reference numbers indicate like features, and wherein.

DETAILED DESCRIPTION

Preferred embodiments of the present disclosure and their advantages are best understood by reference to FIGS. 1 through 4, where like numbers are used to indicate like and corresponding parts.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices, as well as various input and output (I/O) devices, such as a keyboard, a mouse, and a video display. The information handling system may also include one or more buses operable to transmit communications between the various hardware components.

Figure 1:
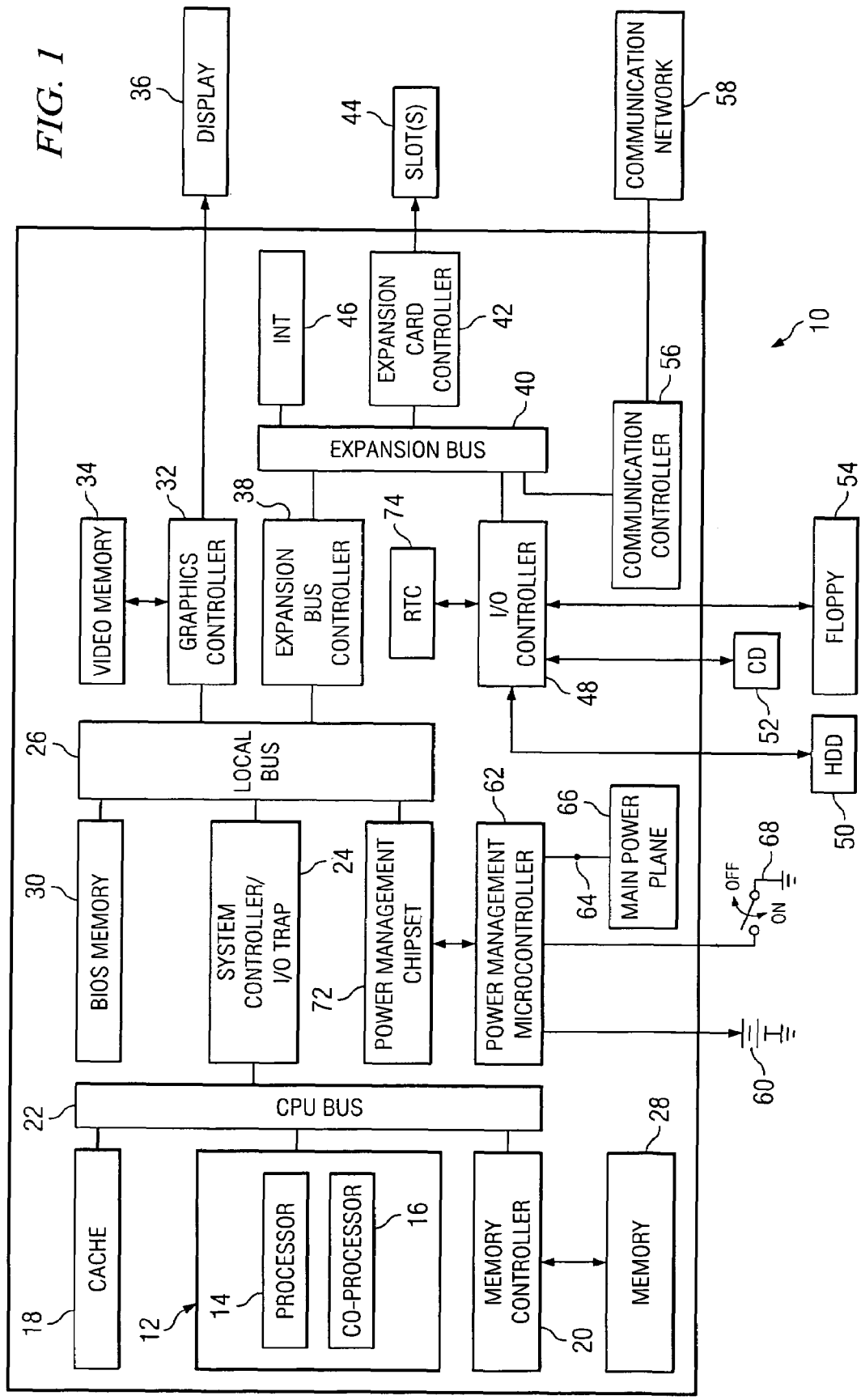
FIG. 1 is a block diagram depicting an exemplary embodiment of an information handling system, according to teachings of the present disclosure.

Referring first to FIG. 1, a block diagram of information handling system 10 is shown, according to teachings of the present disclosure. Information handling system 10 or computer system preferably includes at least one microprocessor or central processing unit (CPU) 12. CPU 12 may include processor 14 for handling integer operations and coprocessor 16 for handling floating point operations. CPU 12 is preferably coupled to cache 18 and memory controller 20 via CPU bus 22. System controller I/O trap 24 preferably couples CPU bus 22 to local bus 26 and may be generally characterized as part of a system controller.

Main memory 28 of dynamic random access memory (DRAM) modules is preferably coupled to CPU bus 22 by a memory controller 20. Main memory 28 may be divided into one or more areas such as system management mode (SMM) memory area (not expressly shown).

Basic input/output system (BIOS) memory 30 is also preferably coupled to local bus 26. FLASH memory or other nonvolatile memory may be used as BIOS memory 30. A BIOS program (not expressly shown) is typically stored in BIOS memory 30. The BIOS program preferably includes software which facilitates interaction with and between information handling system 10 devices such as a keyboard (not expressly shown), a mouse (not expressly shown), or one or more I/O devices. BIOS memory 30 may also store system code (note expressly shown) operable to control a plurality of basic information handling system 10 operations.

Graphics controller 32 is preferably coupled to local bus 26 and to video memory 34. Video memory 34 is preferably operable to store information to be displayed on one or more display 36. Display 36 may be an active matrix or passive matrix liquid crystal display (LCD), a cathode ray tube (CRT) display or other display technology. In selected applications, uses or instances, graphics controller 32 may also be coupled to an integrated display, such as in a portable information handling system implementation.

Bus interface controller or expansion bus controller 38 preferably couples local bus 26 to expansion bus 40. In one embodiment, expansion bus 40 may be configured as an Industry Standard Architecture ("ISA") bus. Other buses, for example, a Peripheral Component Interconnect ("PCI") bus, may also be used.

In certain information handling system embodiments, expansion card controller 42 may also be included and is preferably coupled to expansion bus 40 as shown. Expansion card controller 42 is preferably coupled to a plurality of information handling system expansion slots 44. Expansion slots 44 may be configured to receive one or more expansion cards such as modems, fax cards, communications cards, and other input/output (I/O) devices.

Interrupt request generator 46 is also preferably coupled to expansion bus 40. Interrupt request generator 46 is preferably operable to issue an interrupt service request over a predetermined interrupt request line in response to receipt of a request to issue interrupt instruction from CPU 12.

I/O controller 48, often referred to as a super I/O controller, is also preferably coupled to expansion bus 40. I/O controller 48 preferably interfaces to an integrated drive electronics (IDE) hard drive drive (HDD) 50, CD-ROM (compact disk-read only memory) drive 52 and/or a floppy disk drive (FDD) 54. Other disk drive devices (not expressly shown) that may interface to the I/O controller include a removable hard drive, a zip drive, a CD-RW (compact disk-read/write) drive, and a CD-DVD (compact disk—digital versatile disk) drive.

Communication controller 56 is preferably provided and enables information handling system 10 to communicate with communication network 58, e.g., an Ethernet network. Communication network 58 may include a local area network (LAN), wide area network (WAN), Internet, Intranet, wireless broadband or the like. Communication controller 56 may be employed to form a network interface for communicating with other information handling systems (not expressly shown) coupled to communication network 58.

As illustrated, information handling system 10 preferably includes power supply 60, which provides power to the many components and/or devices that form information handling system 10. Power supply 60 may be a rechargeable battery, such as a nickel metal hydride ("NiMH") or lithium ion battery, when information handling system 10 is embodied as a portable or notebook computer, an A/C (alternating current) power source, an uninterruptible power supply (UPS) or other power source.

Power management microcontroller 62 preferably monitors a charge level of an attached battery or UPS to determine when and when not to charge the battery or UPS. Power management microcontroller 62 is preferably also coupled to main power switch 68, which the user may actuate to turn information handling system 10 on and off. While power management microcontroller 62 powers down one or more portions or components of information handling system 10, e.g., CPU 12, display 36, or HDD 50, etc., when not in use to conserve power, power management microcontroller 62 itself is preferably substantially always coupled to a source of power, preferably power supply 60.

Power supply 60 is preferably coupled to power management microcontroller 62. Power management microcontroller 62 preferably controls the distribution of power from power supply 60. More specifically, power management microcontroller 62 preferably includes power output 64 coupled to main power plane 66 which may supply power to CPU 12 as well as other information handling system components. Power management microcontroller 62 may also be coupled to a power plane (not expressly shown) operable to supply power to an integrated panel display (not expressly shown), as well as to additional power delivery planes preferably included in information handling system 10.

Computer system 10 may also include power management chip set 72. Power management chip set 72 is preferably coupled to CPU 12 via local bus 26 so that power management chip set 72 may receive power management and control commands from CPU 12. Power management chip set 72 is preferably connected to a plurality of individual power planes operable to supply power to respective components of information handling system 10, e.g., HDD 50, FDD 54, etc. In this manner, power management chip set 72 preferably acts under the direction of CPU 12 to control the power supplied to the various power planes and components of a system.

Real-time clock (RTC) 74 may also be coupled to I/O controller 48 and power management chip set 72. Inclusion of RTC 74 permits timed events or alarms to be transmitted to power management chip set 72. Real-time clock 74 may be programmed to generate an alarm signal at a predetermined time as well as to perform other operations.

Figure 2:
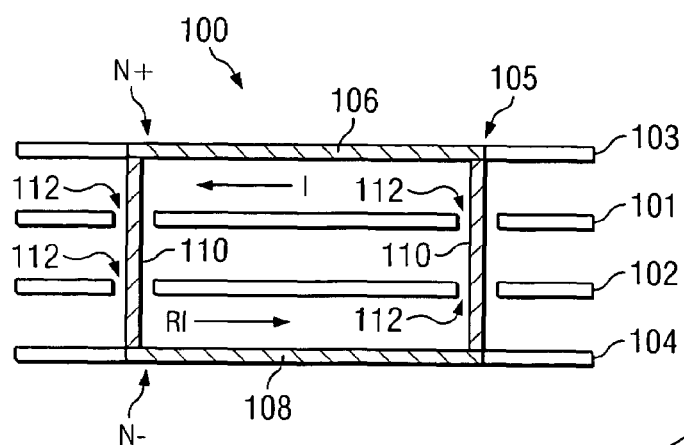
FIG. 2 illustrates a cross-sectional view of a circuit board according to an example embodiment of the present disclosure.

Referring to FIG. 2, a cross-sectional view of circuit board 100 is shown, according to an example embodiment of the present disclosure. Circuit board 100 may include voltage plane 101 and ground plane 102. Voltage plane 101, is typically formed from a layer of copper but can also be formed from any other suitable material that conducts electricity. The copper layer permits voltage plane 101 to provide an electrical current to components associated with circuit board 100. Generally, voltage plane 101 includes any layer or plane that has a non-zero voltage.

Ground plane 102 is similarly formed from a copper layer but can also be formed from any other suitable material that conducts electricity. Ground plane 102 serves to provide a ground or ground path for the electrical current provided by voltage plane 101 or other electrical source. As such, voltage plane 101 and ground plane 102 may form part of an electrical circuit that supplies an electrical current to components associated with circuit board 100. In some embodiments of the present disclosure, voltage plane 101 and ground plane 102 are formed close together on circuit board 100.

Circuit board 100 also includes signal planes 103 and 104. Signal planes 103, 104 are layers that contain electrical traces or traces 105, which can be used to carry electrical current or signals such as data and information. Typically, each signal plane 103, 104 is set or placed closer to either voltage plane 101 or ground plane 102 and, as such, is said to "reference" a particular plane. For example, signal plane 103 is set closer to voltage plane 101 than to ground plane 102, thus signal plane 103 references voltage plane 101. Hence, voltage plane 101 and ground plane 102 are commonly referred to as reference planes.

Trace 105, formed and routed within a portion of circuit board 100, may include two or more separate paths. First path 106 may be formed in signal plane 103 that references voltage plane 101. Second path 108 may be formed in signal plane 104 that references ground plane 102. Generally, one path will reference voltage plane 101 and the other path will reference ground plane 102.

First path 106 is electrically coupled to second path 108 at vias 110. Vias 110 are formed by routing electrical connections from the ends of first path 106 to the ends of second path 108. As each via 110 passes through ground plane 102 or voltage plane 101, opening 112 may be formed to provide an electrically isolated opening for via 110 to pass therethrough.

By forming trace 105 with first path 106 and second path 108, the amount of induced noise into trace 105 coupled from the reference planes, namely voltage plane 101 and/or ground plane 102, is reduced. For example, when a large or fast moving current I (illustrated for clarity only) travels on voltage plane 101, noise N+ may be induced into first path 106 given the proximity of the path to the reference plane. Returning current IR (illustrated for clarity only) that is traveling in the opposite direction of current I moves through ground plane 102. In doing so, ground plane 102 may induce an approximately equal but opposite noise N− in second path 108. Generally, each noise is substantially similar to the other noise but in opposite direction. Thus, when noise N+ induced on first path 106 is combined with opposite noise N− induced on second path 108, the "resultant" noise on trace 105 is reduced or even cancelled.

Figure 3:
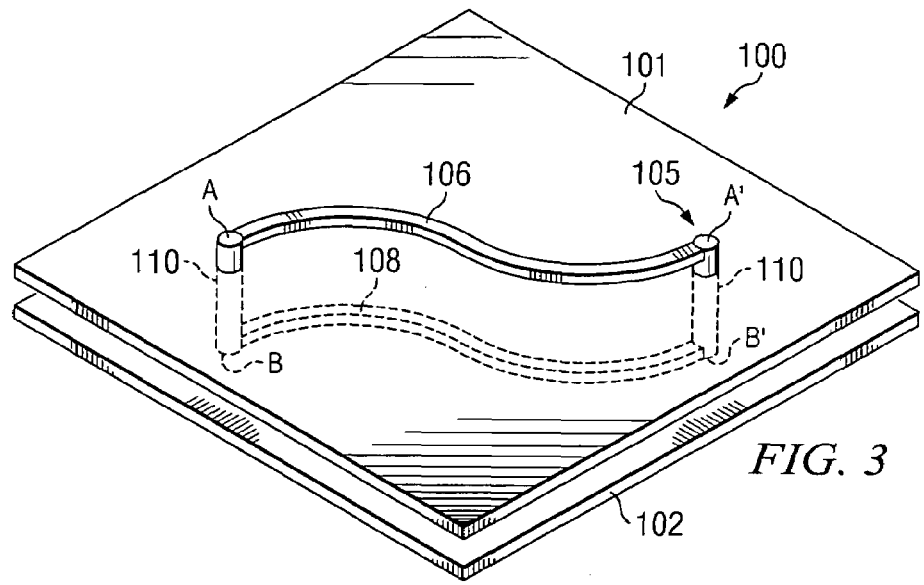
FIG. 3 illustrates a perspective view of the circuit board of FIG. 2 according to an example embodiment of the present disclosure.

Referring to FIG. 3, a perspective view of circuit board 100 of FIG. 2 is shown, according to an example embodiment of the present disclosure. The perspective view is shown without illustrating signal planes 103, 104 in order to provide clarity of the disclosure. Trace 105 including first path 106 and second path 108 is routed on a portion of circuit board 100.

Because the amount of noise induced from a reference plane depends on the orientation of trace 105 to the direction of the current in the reference plane, first path 106 and second path 108 typically follow a substantially similar path in their respective signal layers. For example, first path 106 may be routed from point A to point A', while second path 108 follows a similar route or path that extends from B to B' with each path formed within their respective signal layer (not shown for clarity).

Therefore, by combining the noise from any two substantially similar paths formed on different signal layers that reference different planes (e.g., voltage plane 101 and ground plane 102) such that induced noise on each path is substantially similar but opposite of the other, the resultant noise on trace 105 is reduced or cancelled.

Figure 4:
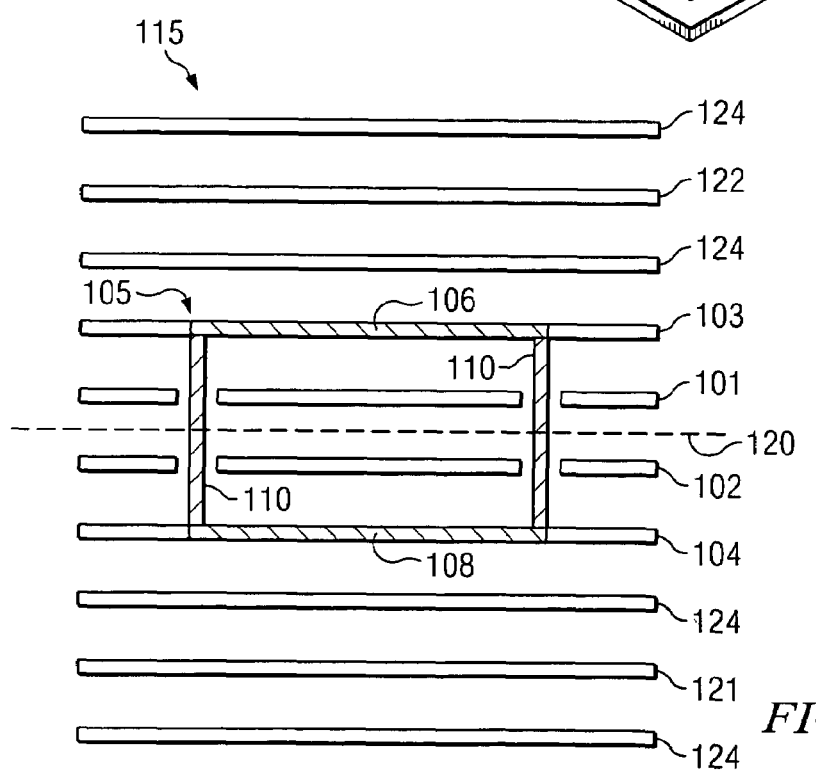
FIG. 4 illustrates a cross-sectional view of a circuit board having an equal number of ground planes as voltage planes according to example embodiments of the present disclosure.

Referring to FIG. 4, a cross-sectional view of circuit board 115 having an equal number of ground planes 102, 122 as voltage planes 101, 121 is shown, according to example embodiments of the present disclosure. Circuit board 115 illustrates an example of a typical computer board that includes several layers including six signal planes 103, 104 and 124, two voltage planes 101, 121 and two ground planes 102, 122.

Circuit board 115 may be viewed as formed about centerline 120. From centerline 120, voltage plane 101 and ground plane 102 are formed close together with each plane being approximately equal distance from centerline 120 such that the planes are symmetrically oriented with respect to circuit board 115.

Extending further from centerline 120, signal planes 103 and 104 are formed near their respective reference planes being approximately equal distance from centerline 120 such that signal planes 103 and 104, and first path 106 and second path 108 are symmetrically oriented with respect to circuit board 115 about centerline 120. Formed on signal plane 103, first path 106 of trace 105 references voltage plane 101. Likewise, second path 108 of trace 105 formed on signal plane 104 references ground plane 102. First path 106 and second path 108 are electrically coupled at each of the ends of the paths with vias 110.

In certain embodiments, first path 105 is located at a distance from voltage plane 101 that is substantially equal to the distance second path 108 is located from ground plane 102. In some embodiments, the symmetry of first path 106 to second path 108 with respect to centerline 120 creates a mirror image of the paths. Additionally, in other embodiments, the symmetrical arrangement of first path 106 and voltage plane 101 creates a mirror image of second path 108 and ground plane 102 with respect to centerline 120.

Mirror imaging of the paths facilitates inducing a substantially similar amount of noise in each path but in opposite directions. Therefore, having paths with a symmetrical arrangement allows for the resultant noise in trace 105 to be substantially reduced or even cancelled.

Although the present disclosure has been described with respect to a specific embodiment, various changes and modifications will be readily apparent to one skilled in the art. The present disclosure is not limited to the illustrated embodiment, but encompasses such changes and modifications that fall within the scope of the appended claims.

What is claimed is:

1. An information handling system comprising:
    a processor;
    a memory communicatively coupled to the processor; and a circuit board communicatively coupled to the processor, the circuit board comprising:
        a voltage plane forming a first layer of the circuit board, the voltage plane operable to provide an electrical current;
        a ground plane forming a second layer of the circuit board, the ground plane operable to provide a ground for the electrical current;
        an electrical trace, electrically distinct from the voltage plane and the ground plane, the electrical trace including a first continuous path and a second continuous path, the first continuous path located closer to the ground plane than to the voltage plane and the second continuous path located closer to the voltage plane than to the ground plane, whereby the first path is substantially similar to the second path; and
        the first path electrically coupled to the second path by a first conductive via connecting a first end of the first path with a first end of the second path and by a second conductive via connecting a second end of the first path with a second end of the second path, each of the first and second vias electrically distinct from both the voltage plane and the ground plane.

2. The information handling system of claim 1, wherein the first path is located at a distance from the ground plane that is substantially equal to the distance the second path is located from the voltage plane.

3. The information handling system of claim 1, wherein the ground plane and the voltage plane are symmetrically oriented about the circuit board.

4. The information handling system of claim 3, wherein the first path and the second path are symmetrically oriented about the circuit board.

5. The information handling system of claim 4, wherein the first path and the ground plane are a mirror image of the second path and the voltage plane.

6. An information handling system comprising:
    an integrated circuit; and
    a circuit board communicatively coupled to the integrated circuit, the circuit board comprising:
        an electrically conductive voltage plane forming a first layer of the circuit board;
        an electrically conductive ground plane forming a second layer of the circuit board; and
        an electrically conductive trace electrically distinct from both the voltage plane and the ground plane, the electrically conductive trace comprising:
            a first portion lying in a first plane located closer to the ground plane than to the voltage plane;
            a second portion lying in a second plane located closer to the voltage plane than to the ground plane;
            a first electrically conductive via connecting a first point of the first portion with a first point of the second portion, the first via electrically distinct from both the voltage plane and the ground plane; and
            a second electrically conductive via connecting a second point of the first portion with a second point of the second portion, the second via electrically distinct from both the voltage plane and ground plane.

7. The information handling system of claim 6, wherein first and second portions mirror each other in their respective planes.

8. The information handling system of claim 6, wherein a displacement between the first plane and the ground plane is substantially equal to a displacement between the second plane and the voltage plane.

9. The information handling system of claim 6, wherein the ground plane and the voltage plane are equidistant from a center plane of the circuit board.

10. The information handling system of claim 6, wherein the first plane and a plane the second plane are equidistant from a center plane of the circuit board.

11. An information handling system, comprising:
    an integrated circuit; and
    a circuit board coupled to the integrated circuit, the circuit board comprising:
        an electrically conductive voltage plane operable to receive a supply voltage;
        an electrically conductive ground plane operable to receive a ground voltage; and an electrically conductive trace electrically distinct from both the voltage plane and the ground plane and operable to receive a data signal, the electrically conductive trace comprising:
- a first portion lying in a first plane located closer to the ground plane than to the voltage plane;
- a second portion lying in a second plane located closer to the voltage plane than to the ground plane;
- a first electrically conductive via connecting a first point of the first portion with a first point of the second portion, the first via electrically distinct from both the voltage plane and the ground plane; and
- a second electrically conductive via connecting a second point of the first portion with a second point of the second portion, the second via electrically distinct from both the voltage plane and ground plane.

12. The information handling system of claim 11, wherein first and second portions mirror each other in their respective planes.

13. The information handling system of claim 11, wherein a displacement between the first plane and the ground plane is substantially equal to a displacement between the second plane and the voltage plane.

14. The information handling system of claim 11, wherein the ground plane and the voltage plane are equidistant from a center plane of the circuit board.

15. The information handling system of claim 11, wherein the first plane and the second plane are equidistant from a center plane of the circuit board.

16. The information handling system of claim 11, wherein the supply voltage is a DC voltage and the data signal is a time varying signal.

* * * * *